(12) United States Patent  
Jeon

(10) Patent No.: US 7,491,991 B2  
(45) Date of Patent: Feb. 17, 2009

(54) METHOD FOR FABRICATING CMOS IMAGE SENSOR

(75) Inventor: In Gyun Jeon, Gunpo-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 127 days.

(21) Appl. No.: 11/448,426

(22) Filed: Jun. 7, 2006

(65) Prior Publication Data

US 2006/0273363 A1    Dec. 7, 2006

(30) Foreign Application Priority Data

Jun. 7, 2005    (KR)    ...................... 10-2005-0048480

(51) Int. Cl.
*H01L 21/00* (2006.01)
(52) U.S. Cl. .................. 257/292; 257/290; 257/291
(58) Field of Classification Search .......... 257/E27.133, 257/290–292; 438/48, 120, 73
See application file for complete search history.

(56) References Cited

U.S. PATENT DOCUMENTS

| | | | | |
|---|---|---|---|---|
| 6,127,668 | A * | 10/2000 | Baek ....................... | 250/208.1 |
| 6,433,373 | B1 * | 8/2002 | Lee et al. .................. | 257/292 |
| 6,504,194 | B1 * | 1/2003 | Miida ....................... | 257/292 |
| 6,514,785 | B1 * | 2/2003 | Chiang et al. ............. | 438/48 |
| 6,570,201 | B2 * | 5/2003 | Shim ........................ | 257/292 |
| 6,677,627 | B2 * | 1/2004 | Miida ....................... | 257/292 |
| 6,767,312 | B2 * | 7/2004 | Shim ........................ | 438/59 |
| 6,974,983 | B1 * | 12/2005 | Hill et al. .................. | 257/292 |
| 7,005,315 | B2 * | 2/2006 | Hong et al. ................ | 438/73 |
| 7,037,748 | B2 * | 5/2006 | Han ........................... | 438/73 |
| 7,122,408 | B2 * | 10/2006 | Mouli et al. ............... | 438/134 |
| 7,214,575 | B2 * | 5/2007 | Rhodes ..................... | 438/197 |
| 2002/0163023 | A1 * | 11/2002 | Miida ....................... | 257/292 |
| 2002/0167030 | A1 * | 11/2002 | Miida ....................... | 257/215 |
| 2005/0093036 | A1 * | 5/2005 | Han .......................... | 257/291 |
| 2005/0148114 | A1 * | 7/2005 | Rhodes ..................... | 438/120 |
| 2005/0233494 | A1 * | 10/2005 | Hong ........................ | 438/57 |
| 2005/0250240 | A1 * | 11/2005 | Hong et al. ................ | 438/57 |
| 2005/0280054 | A1 * | 12/2005 | Park et al. ................. | 257/290 |
| 2006/0118836 | A1 * | 6/2006 | Rhodes ..................... | 257/292 |
| 2006/0138491 | A1 * | 6/2006 | Jeon ......................... | 257/292 |

(Continued)

FOREIGN PATENT DOCUMENTS

KR    10-2003-0027813    11/2004

*Primary Examiner*—Laura M Menz
(74) *Attorney, Agent, or Firm*—Saliwanchik, Lloyd & Saliwanchik

(57) ABSTRACT

A method for fabricating a CMOS image sensor is provided. The method includes: forming a gate electrode with a gate insulating layer interposed on a transistor region of a semiconductor substrate having an active region defined by a photo diode and a transistor region; forming a first impurity region of a first conductive type at a transistor region at one side of the gate electrode; forming a second impurity region of a first conductive type at a photo diode region at other side of the gate electrode; forming sidewall insulating layers at both sides of the gate electrode; forming a third impurity region of a first conductive type at one side of a gate electrode where the first impurity region is formed; and forming a fourth impurity region of a second conductive type at the gate electrode, the photodiode region and the transistor region by implanting impurity ions of a second conductive type on the entire surface of the semiconductor substrate.

20 Claims, 6 Drawing Sheets

U.S. PATENT DOCUMENTS

2006/0273321 A1* 12/2006 Hun .............................. 257/72
2006/0273363 A1* 12/2006 Gyun .......................... 257/292
2007/0077678 A1* 4/2007 Oh et al. ....................... 438/60

* cited by examiner

METHOD FOR FABRICATING CMOS IMAGE SENSOR

RELATED APPLICATION

This application claims the benefit, under 35 U.S.C. §119 (e), of Korean Patent Application No. 10-2005-0048480 filed Jun. 7, 2005, which is incorporated herein by reference in its entirety.

FIELD OF THE INVENTION

The present invention relates to a method for fabricating a CMOS image sensor.

BACKGROUND OF THE INVENTION

Generally, an image sensor is a semiconductor device that transforms an optical image to an electric signal. An image sensor can be classified as a charge coupled device (CCD) or a complementary metal oxide silicon (CMOS) image sensor.

The CCD has shortcomings such as a complicated driving method and high power consumption. Also, the fabricating method of the CCD is complicated because a multi-level photo process is required.

Therefore, the CMOS image sensor has received attention as a next-generation image sensor to overcome the shortcomings of the CCD.

The CMOS image sensor is a device employing a switching mode that sequentially detects outputs of each unit pixel using MOS transistors. The switching mode can incorporate MOS transistors formed on a semiconductor substrate in a number at least as many as the number of unit pixels, and can use a control circuit and a signal processing circuit as peripheral circuits.

The CMOS image sensor can be classified into types such as a 3T type, a 4T type, and a 5T type, according the number of transistors. For example, the 3T type CMOS image sensor includes one photodiode and three transistors, and the 4T type CMOS image sensor includes one photodiode and four transistors.

Hereinafter, the unit pixel of the 4T type CMOS image sensor will be described with reference to a plan view thereof.

As shown in FIG. 1, the unit pixel of the CMOS image sensor according to the prior art includes a photodiode 10 and four transistors as an optoelectric converter. The four transistors are a transfer transistor 20, a reset transistor 30, an access transistor 40 and a select transistor 50. In FIG. 1, FD denotes a floating diffusion region and a numeral reference 90 denotes a coupling portion connecting the FD and the access transistor 40. Vin denotes an input terminal, and Vout denotes an output terminal.

Hereinafter, the photodiode 10 and the transfer transistor 20 in the CMOS image sensor according to the prior art will be described with reference to a cross-section view through line I-I'.

As shown in FIG. 2, the transfer transistor 20 includes a gate insulating layer 21 and a gate electrode 23 formed on a substrate 11, and a first sidewall 29 and a second sidewall 31 formed at both sides of the gate electrode 23.

In addition an n− type diffusion region (N−) 28 and a P° type diffusion region (PDP; P type photodiode implant) 35 are formed at the photodiode region (PD) of the substrate 11. The P° type diffusion region 35 is formed on the n− type diffusion region 28. Also, a heavily doped n+ type diffusion region (N+) 32 and a lightly doped n− type diffusion region (N−) 26 are formed at the floating diffusion region (FD) of the substrate 11.

FIG. 3 is a cross-sectional view for describing one of processes for fabricating a CMOS image sensor according to the prior art.

As shown in FIG. 3, a photoresist layer 34 can be applied on an entire surface of the substrate 11, and the applied photoresist layer 27 can be patterned to expose the photodiode region (PD) through an exposing and developing process.

Then, a P° type diffusion region 35 can be formed in the n-type diffusion region 28 of the photodiode region by implanting P° type impurity ions using the patterned photoresist layer 34 as a hard mask.

However, the method for fabricating a CMOS image sensor according to the prior art has problems as follows.

The relevant art's fabricating method becomes complicated because a photolithography process, which includes applying a photoresist layer, exposing and developing the photoresist layer, implanting impurity ions, and removing the photoresist layer, is performed in order to form the P° type diffusion region (PDP) at the photodiode region.

SUMMARY OF THE INVENTION

Accordingly, the present invention is directed to a method for fabricating a CMOS image sensor that can address one or more problems of the prior art.

An object of the present invention is to provide a method for fabricating a CMOS image sensor that can improve yield by simplifying a fabricating process through omitting a photolithography process when ion implantation is performed for forming a PDP.

Another object of the present invention is to provide a method for fabricating a CMOS image sensor that can improve quality of the CMOS sensor by omitting a fabricating process that may create impurities through omitting a photolithography process when ion implantation is performed for forming a PDP.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of fabricating a CMOS image sensor, the method including: forming a gate electrode with a gate insulating layer interposed on a transistor region of a semiconductor substrate having an active region defined by a photo diode and a transistor region; forming a first impurity region of a first conductive type at a transistor region at one side of the gate electrode; forming a second impurity region of a first conductive type at a photo diode region at the other side of the gate electrode; forming sidewall insulating layers at both sides of the gate electrode; forming a third impurity region of a first conductive type at one side of a gate electrode where the first impurity region is formed; and forming a fourth impurity region of a second conductive type at the gate electrode, the photodiode region, and the transistor region by implanting a second conductive impurity ion on the entire surface of the semiconductor substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a CMOS image sensor according to the present invention will be described with reference to accompanying drawings.

In the CMOS image sensor according to an embodiment of the present invention, a transfer transistor can have, for example, an NMOS transistor structure. However, the transfer transistor can alternatively have a PMOS type structure.

An embodiment of the present invention relates to a method for fabricating a CMOS image sensor having four transistors. However, the embodiment of the present invention can be applied to a method for fabricating a CMOS image sensor having other numbers of transistors such as one, three, five, or more transistors.

FIGS. 4A through 4H are cross-sectional views for illustrating a CMOS image sensor according to an embodiment of the present invention.

Figure 1:
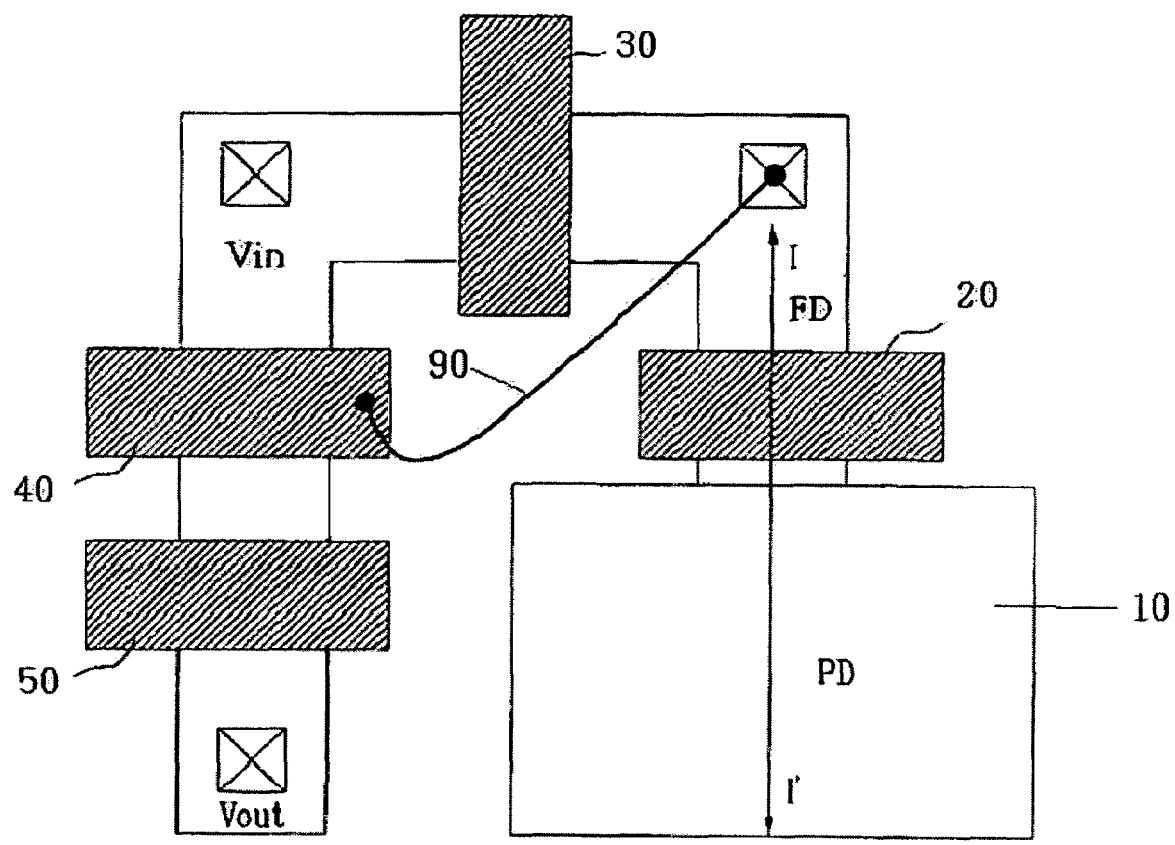
FIG. 1 is a plan view of a unit pixel in a 4T type CMOS image sensor according to the prior art.
Figure 2:
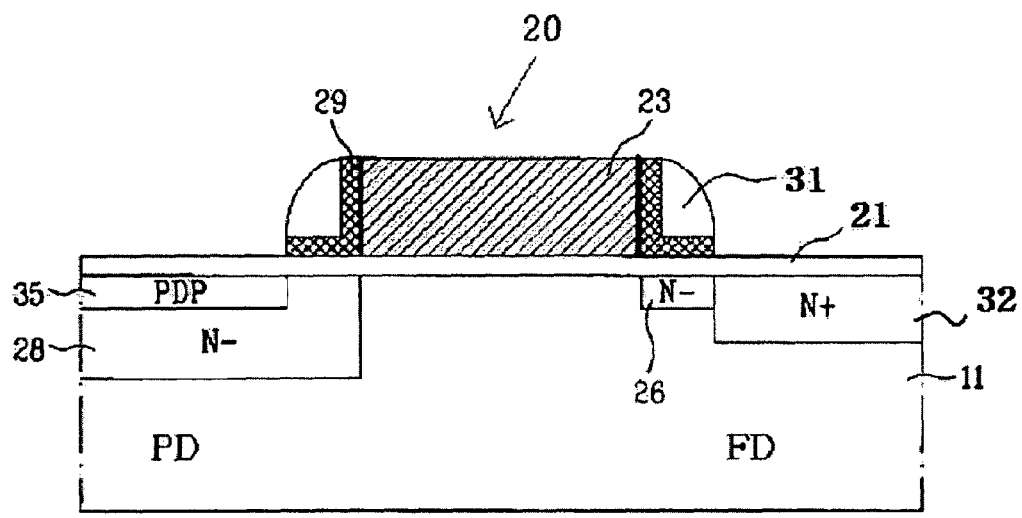
FIG. 2 is a cross-sectional view taken along the line I-I' of FIG. 1 for showing a photodiode and a transfer gate.
Figure 3:
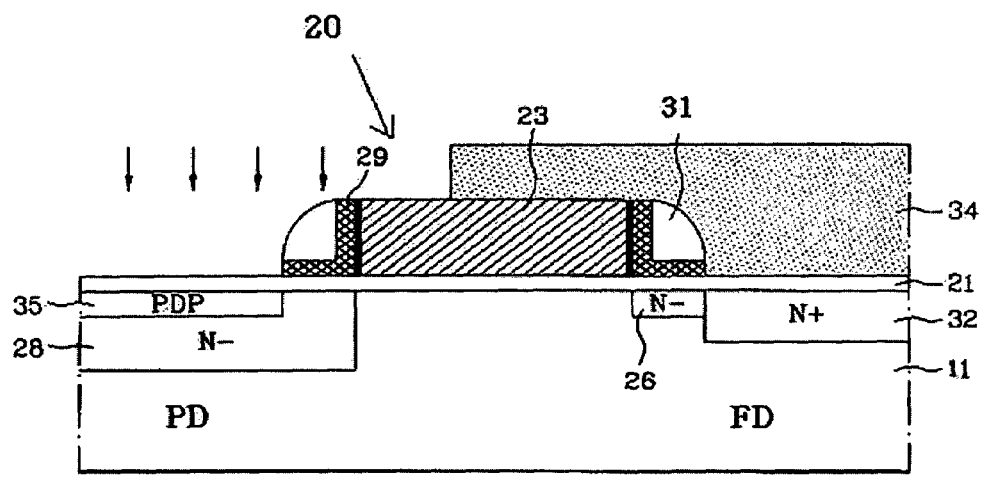
FIG. 3 is a cross-sectional view for describing one of the processes for fabricating a CMOS image sensor according to the prior art.
Figure 4A:
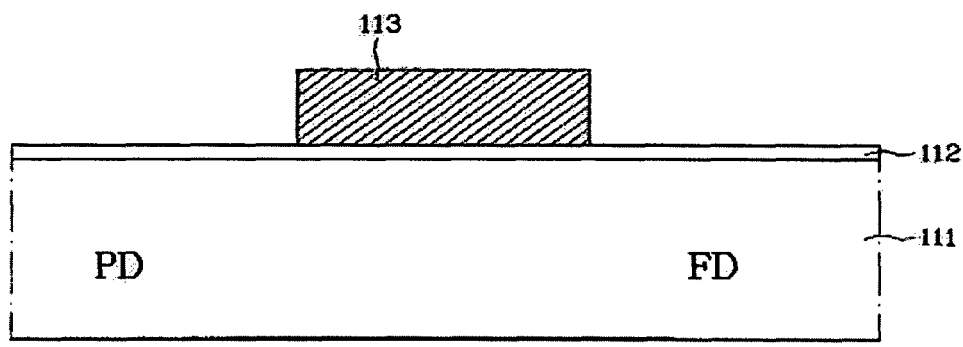
FIGS. 4A through 4H are cross-sectional views for describing a method for fabricating a CMOS image sensor according to an embodiment of the present invention.

As shown in FIG. 4A, a substrate 111 can incorporate a lightly doped P type epitaxial layer by performing an epitaxial process on a semiconductor substrate such as heavily doped P++ type mono crystal silicon.

An epitaxial layer is formed in order to improve the capability of a low-voltage photodiode for accumulating photocharge and to improve photo sensitivity thereof by greatly and deeply forming the depletion region at the photodiode.

In addition, a P-well can be formed in the substrate 111 by ion implantation.

Then, a gate insulating layer 112 and a conductive layer, for example, a heavily doped poly silicon layer, can be formed in sequence. Gate electrode 113 can then be formed by selectively removing the conductive layer through a photo and etching process.

In an embodiment, the gate insulating layer 112 can be formed by performing a thermal oxidation process or a chemical vapor deposition (CVD) on the semiconductor substrate.

In a further embodiment, the gate electrode can be formed by forming a silicide layer (not shown) on the conductive layer.

Figure 4B:
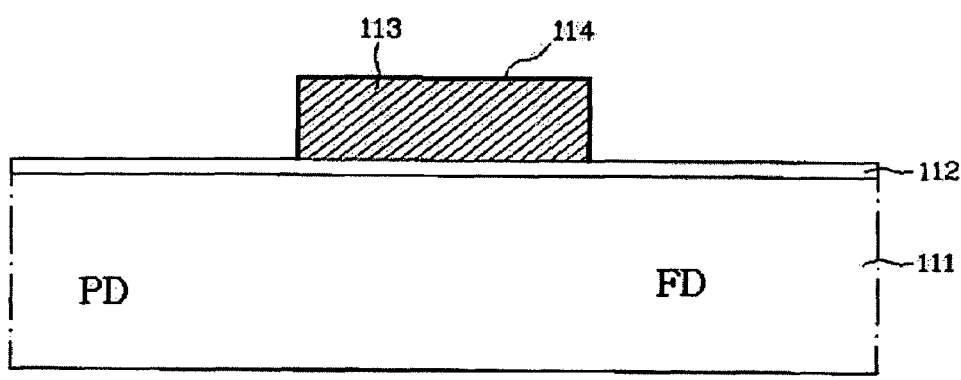

As shown in FIG. 4B, an oxide layer 114 can be formed on the gate electrode 113. In a specific embodiment, about 60 Å and less of a thermal oxide layer 114 can be formed on the surface of the gate electrode 113. The oxide layer 114 can function as a sidewall of a gate for implanting ion for source/drain of a transistor.

Also, the oxide layer 114 can effectively block $P^o$ type impurity ions from being implanted into the gate electrode 113 during $P^o$ type impurity ion implantation for forming the $P^o$ type diffusion region (PDP) 124.

Figure 4C:
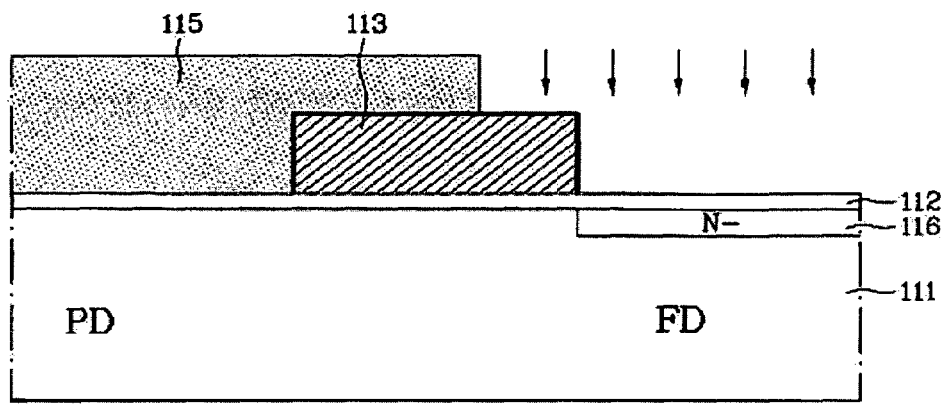

As shown in FIG. 4C, a first photoresist layer 115 is applied on the substrate 111, and the first photoresist layer 115 is patterned to cover the photodiode region and to expose the floating diffusion region.

Then, an n– type diffusion region 116 is formed by implanting lightly doped n– type impurity ions at the exposed floating diffusion region using the patterned first photoresist layer 115 as a hard mask.

Figure 4D:
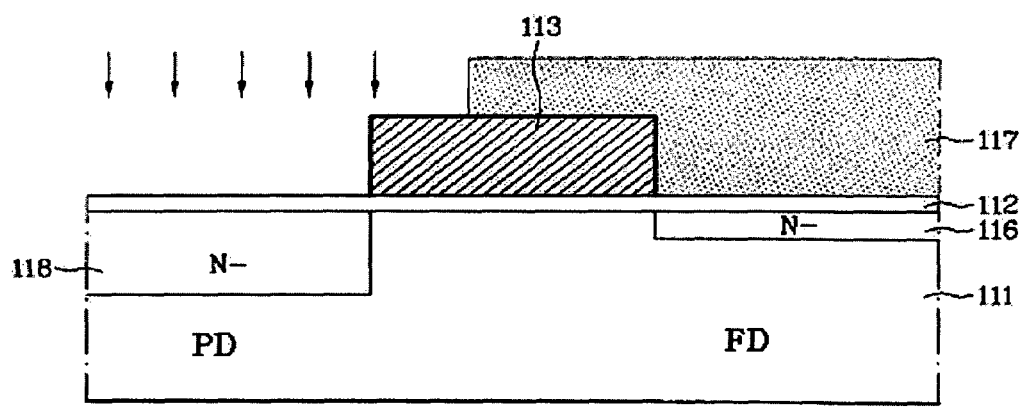

As shown in FIG. 4D, after the first photoresist layer 115 is removed, a second photoresist layer 117 is applied on the entire surface of the substrate 111 and patterned to expose the photodiode region through an exposing and developing process.

A lightly doped n– type diffusion region (PDN) 118 is formed at the photodiode region by implanting lightly doped n– type impurity ions at ion implanting energy of about 100 KeV to 500 KeV using the patterned second photoresist layer 117 as a hard mask.

The impurity ion implantation for forming the lightly doped n– type diffusion region 118 at the photodiode region is performed at higher energy than that for forming the lightly doped n– type diffusion region 116 at the floating diffusion region in order to form the lightly doped n– type diffusion region 118 more deeply.

Figure 4E:
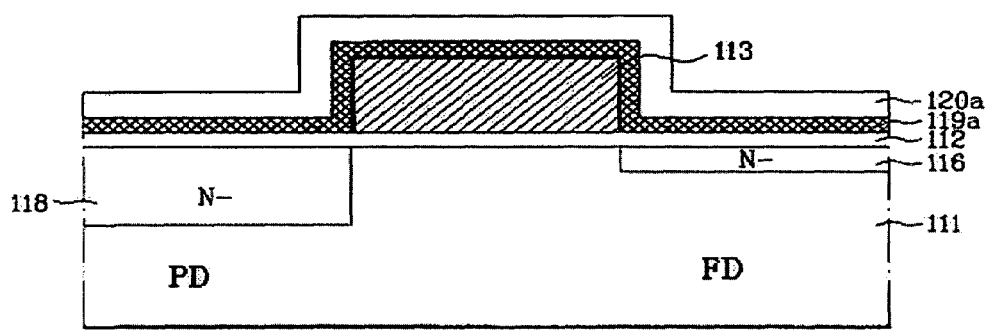

As shown in FIG. 4E, the second photoresist layer 117 is removed, and a first insulating layer 119a and a second insulating layer 120a are sequentially formed on the entire substrate 111 through chemical vapor deposition or low voltage chemical vapor deposition.

In an embodiment, the first insulating layer 119a can be an oxide layer, and the second insulating layer 120a can be a nitride layer 120a.

In a specific embodiment, the first insulating layer 119a can be formed to a thickness of about 150 Å to 250 Å, and the second insulating layer 120a can be formed to a thickness of about 700 Å to 900 Å.

Figure 4F:
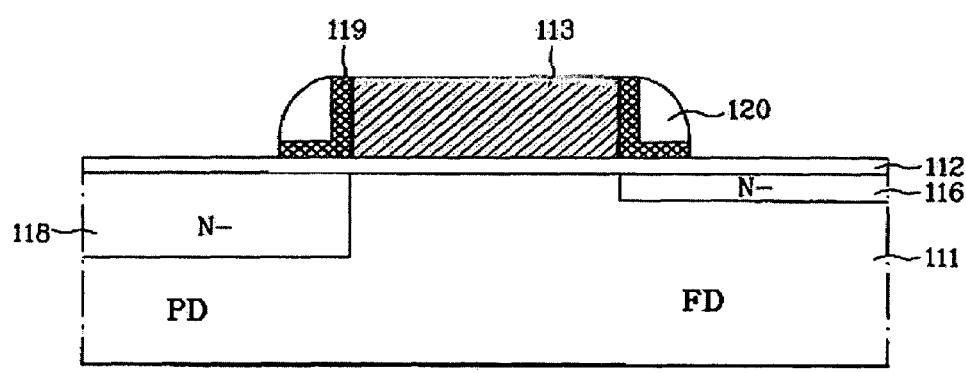

As shown in FIG. 4F, a first sidewall layer 119 and a second sidewall layer 120 are formed at both sides of the gate electrode 113 by performing an etch-back of the first insulating layer 119a and the second insulating layer 120a.

Figure 4G:
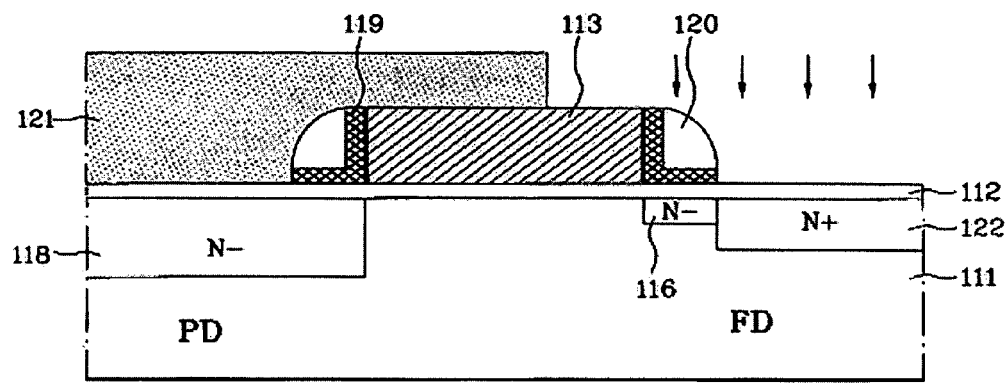

As shown in FIG. 4G, a third photoresist layer 121 is applied on the substrate 111 and is patterned to remain on the photodiode region through an exposing and developing process.

Then, an n+ type diffusion region 122 is formed at the floating diffusion region by implanting heavily doped n+ impurity ions using the patterned third photoresist layer 121 as a hard mask.

Figure 4H:
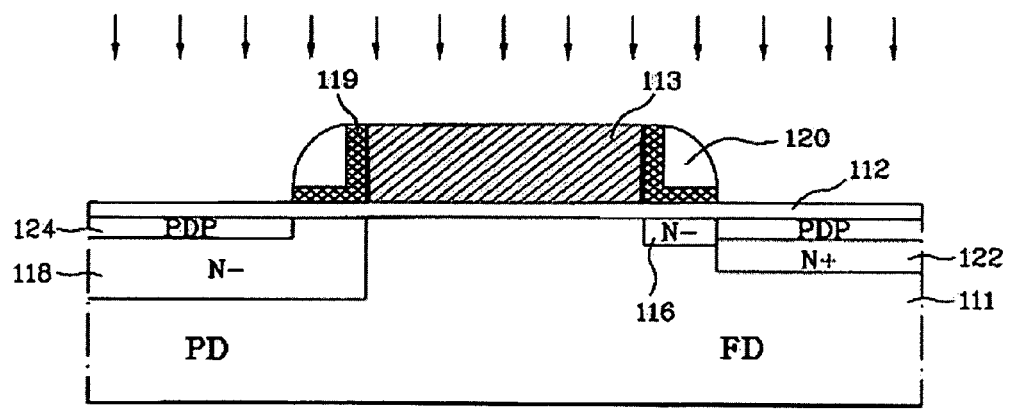

As shown in FIG. 4H, the third photoresist layer 121 is removed, and a $P^o$ type diffusion region (PDP) 124 is formed at the n– type diffusion region 118 of the photodiode region by implanting $P^o$ type impurity ion on the entire surface of the substrate using the first sidewall insulating layer 119 and the second sidewall insulating layer 120 as a hard mask.

Although the P° type impurity ion can be implanted into the n+ type diffusion region 122 when the P° type diffusion region 124 is formed, it does not influence the performance of the transistor.

For embodiments incorporating the oxide layer 114 formed on the gate electrode 113, the oxide layer 114 can effectively block the P° type impurity ions from being implanted into the gate electrode 113.

Moreover, implantation dose and implantation energy can be used to ensure that transistor characteristics are protected from influence of the P° type impurity ions. For example, for the P° type impurity ions that are implanted into the gate electrode 113 of the transistor, the characteristics of the transistor can still be protected by controlling the ion impurity dose and the implanting energy.

In embodiments of the subject method, $BF_2$ or Boron can be used as an impurity ion source.

When $BF_2$ is implanted as the impurity ion source, the ion implantation can be performed at a dose of $1 \times 10^{11}$ to $5 \times 10^{12}$ atoms/cm$^2$ with the ion implanting energy of 40 KeV and less such that the dopant concentration is about $1 \times 10^{16}$ to $5 \times 10^{17}$ atoms/cm$^3$.

When Boron is implanted as the impurity ion source, the ion implantation can be performed at a dose of $1 \times 10^{11}$ to $5 \times 10^{12}$ atoms/cm$^2$ with the ion implanting energy of 10 KeV and less such that the dopant concentration is about $1 \times 10^{16}$ to $5 \times 10^{17}$ atoms/cm$^3$.

Accordingly, the characteristics of a transistor can be protected from being influenced controlling the impurity ion dose and the implanting energy when the P° impurity ions are implanted. In addition, the fabrication process can be simplified by performing the ion implantation through controlling the impurity ion dose and the implanting energy without performing a photolithography process when the PDP ion is implanted at the photodiode region.

In a further embodiment, a thermal process, for example, a rapid thermal process, can be performed on the semiconductor substrate at a temperature of about 800° C. to 1200° C. to diffuse the impurity ions in the n− type diffusion region 116, the P° type diffusion region 124, the n− type diffusion region 118, and the n+ type diffusion region 122.

According to the present invention, a fabricating process can be simplified by performing the ion implantation through controlling the impurity ion dose and the implanting energy without performing a photolithography process when a PDP ion is implanted at the photodiode region.

According to the present invention, the CMOS image sensor having high quality can be fabricated by skipping a process that can create impurities through omitting a photolithography process when the PDP ion implanted in the fabricating process for the CMOS image sensor.

It will be apparent to those skilled in the art that various modifications and variations can be made in the present invention. Thus, it is intended that the present invention covers the modifications and variations of the invention provided they come within the scope of the appended claims and their equivalents.

I claim:

1. A method for fabricating a CMOS image sensor comprising:
   forming a gate electrode with a gate insulating layer interposed on a transistor region of a semiconductor substrate having an active region defined by a photodiode and the transistor region;
   forming a first impurity region of a first conductive type at the transistor region at a first side of the gate electrode;
   forming a second impurity region of the first conductive type at the photodiode region at a second side of the gate electrode;
   forming sidewalls comprising a first insulating layer and a second insulating layer at the first side and the second side of the gate electrode;
   forming a third impurity region of the first conductive type at the first side of the gate electrode where the first impurity region is formed; and
   forming a fourth impurity region of a second conductive type by implanting impurity ions of a second conductive type into the gate electrode, the photodiode region including the second impurity region, and the transistor region using the sidewalls as a hard mask.

2. The method according to claim 1, wherein the second impurity region is formed deeper in the substrate than the first impurity region.

3. The method according to claim 1, further comprising forming 60 Å and less of an oxide layer on a top and side surfaces of the gate electrode.

4. The method according to claim 1, wherein forming the first impurity region comprises forming a lightly doped n− type diffusion region by implanting impurity ions of an n type at the transistor region.

5. The method according to claim 1, wherein forming the second impurity region comprises forming a lightly doped n− type diffusion region by implanting impurity ions of an n type into the photodiode region at an ion implanting energy of 100 KeV to 500 KeV.

6. The method according to claim 1, wherein forming the third impurity region comprises forming a n+ type diffusion region by implanting impurity ions of the n type at the transistor region of the substrate.

7. The method according to claim 1, wherein forming the fourth impurity region comprises forming a P° diffusion region on the second impurity region and the third impurity region by implanting P° impurity ions into the entire substrate using the sidewalls as a hard mask.

8. The method according to claim 1, wherein forming the fourth impurity region comprises forming a P° diffusion region on the second impurity region, the third impurity region, and the gate electrode by implanting P° impurity ion into the entire substrate using the sidewalls as a hard mask.

9. The method according to claim 1, wherein the impurity ions of the second conductive type are $BF_2$.

10. The method according to claim 9, wherein the implantation dose of the $BF_2$ ion is $1 \times 10^{11}$ atoms/cm$^2$ to $5 \times 10^{12}$ atoms/cm$^2$.

11. The method according to claim 9, wherein the ion implanting energy is about 40 KeV and less for implanting the $BF_2$ ions.

12. The method according to claim 9, wherein the dopant concentration of the fourth impurity region is $1 \times 10^{16}$ atoms/cm$^3$ to $5 \times 10^{17}$ atoms/cm$^3$.

13. The method according to claim 1, wherein the impurity ions of the second conductive type are boron.

14. The method according to claim 13, wherein the implantation dose of the boron ion is $1 \times 10^{11}$ atoms/cm$^2$ to $5 \times 10^{12}$ atoms/cm$^2$.

15. The method according to claim 13, wherein ion implanting energy is 10 KeV and less for implanting the boron ions.

16. The method according to claim 13, wherein the dopant concentration of the fourth impurity region is $1 \times 10^{16}$ atoms/cm$^3$ to $5 \times 10^{17}$ atoms/cm$^3$.

17. The method according to claim 1, further comprising performing a thermal process on the substrate after forming the fourth impurity region.

18. The method according to claim 1, wherein the first insulating layer is 150 Å to 250 Å and the second insulating layer is 700 Å to 900 Å.

19. The method according to claim 1, wherein forming the sidewalls comprises:

sequentially depositing the first insulating layer and the second insulating layer; and performing an etch-back process on the first insulating layer and the second insulating layer.

20. The method according to claim 1, further comprising forming an oxide layer on the gate electrode of about 60 Å and less.

* * * * *